United States Patent [19]
Mori

[11] Patent Number: 5,604,379
[45] Date of Patent: Feb. 18, 1997

[54] SEMICONDUCTOR DEVICE HAVING EXTERNAL ELECTRODES FORMED IN CONCAVE PORTIONS OF AN ANISOTROPIC CONDUCTIVE FILM

[75] Inventor: Katsunobu Mori, Nara, Japan

[73] Assignee: Sharp Kabushiki Kaisha, Osaka, Japan

[21] Appl. No.: 452,691

[22] Filed: May 30, 1995

[30] Foreign Application Priority Data

Sep. 21, 1994 [JP] Japan ..................... 6-226807

[51] Int. Cl.$^6$ .......................... H01L 23/48; H01L 23/52; H01L 29/40
[52] U.S. Cl. .......................... 257/738; 257/737; 257/778; 257/780
[58] Field of Search .................................. 257/668, 697, 257/690, 737, 738, 778, 779, 780

[56] References Cited

U.S. PATENT DOCUMENTS 4,811,081  3/1989  Lyden ....................... 257/668

FOREIGN PATENT DOCUMENTS 6-120297  4/1994  Japan.

*Primary Examiner*—Carl Whitehead, Jr.
*Attorney, Agent, or Firm*—Nixon & Vanderhye P.C.

[57] ABSTRACT

A semiconductor device comprising a semiconductor chip, a plurality of electrode pads formed on the semiconductor chip, a metal wiring having a desired pattern and connected to the electrode pads, an anisotropic conductive film containing fine conductive particles and laminated on the semiconductor chip including the metal wiring, and an external electrode, in which the anisotropic conductive film has a concave portion at a desired portion on the metal wiring and the metal wiring is connected to the external electrode through the intermediary of the fine conductive particles present in the anisotropic conductive film by stuffing and sticking the external electrode in the concave portion.

6 Claims, 8 Drawing Sheets

SEMICONDUCTOR DEVICE HAVING EXTERNAL ELECTRODES FORMED IN CONCAVE PORTIONS OF AN ANISOTROPIC CONDUCTIVE FILM

BACKGROUND OF THE INVENTION

1. Field of the Invention

The invention relates to a semiconductor device and a method for forming the same. In particular, it relates to a semiconductor device in which a semiconductor chip is molded into a package and a method for forming the same.

2. Description of the Related Art

Figure 15:
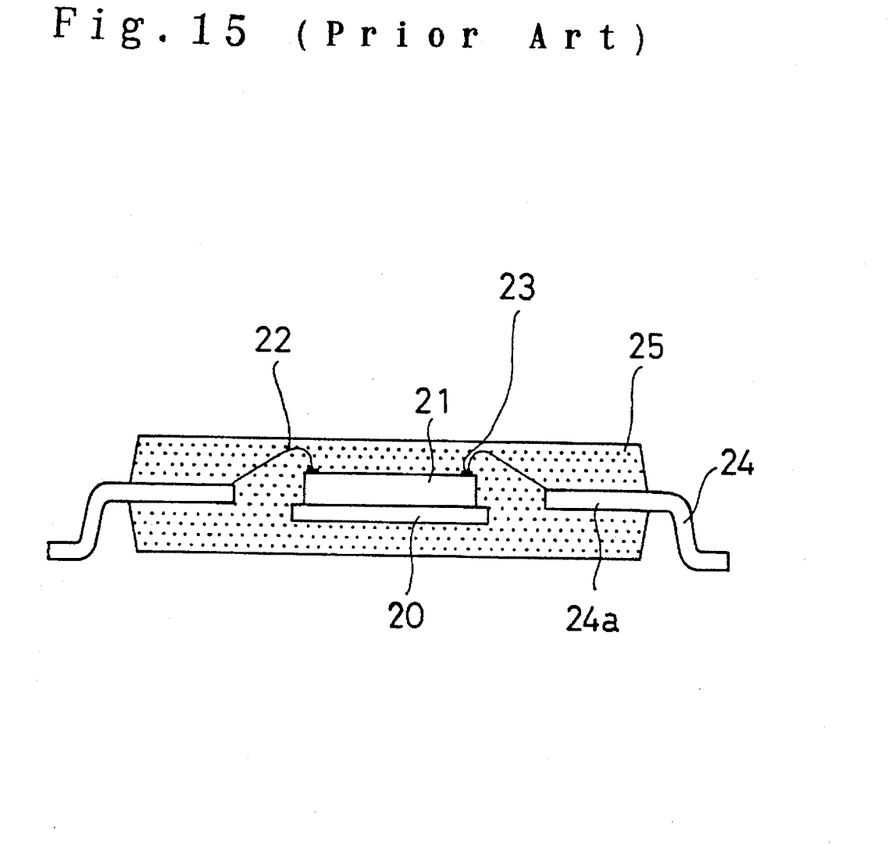
FIG. 15 is a schematic sectional view showing a conventional QFP.

The surface mount device (SMD) which is a conventionally known semiconductor device packaged as a surface mounting type is described with reference to the figures. A semiconductor device shown in FIG. 15 is a device called the quad flat package (QFP) type. The QFP is a plastic package in a fixed form, in which outer leads working as external terminals extend from the side surface of the package and are fixed to a mounting substrate by using a solder. The QFP type device is constituted as follows; a semiconductor chip 21 is fixed to an island (die pad) 20 formed on a metal frame which is the same as an outer lead 24 by using an epoxy-conductive paste for die bonding; an electrode pad 23 formed on the surface of the fixed semiconductor chip 21 is connected to an inner lead 24a connecting to the outer lead 24 by using a metal wiring 22 such as Au; and the semiconductor chip 21, inner lead 24a and metal wiring 22 are molded with a resin 25.

Figure 16:
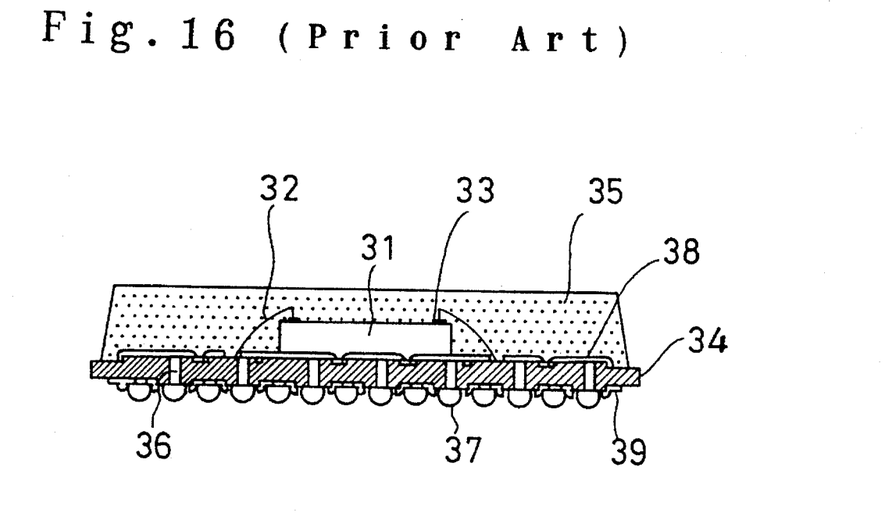
FIG. 16 is a schematic sectional view showing a conventional BGA package.

FIG. 16 shows a ball grid alley (BGA) type semiconductor device. The BGA comprises solder balls on the whole bottom surface of the package used as external terminals, in which the package enables the outer lead pitch of a QFP to be provided with a large number of pins generally having a fine pitch of 0.3 to 0.5 mm. The BGA type device is constituted as follows; a semiconductor chip 31 is fixed on a resin substrate 34 by using the epoxy-conductive paste for die bonding; the resin substrate 34 is provided with wiring layers 38 and 39 on the front and the back surface thereof; the front surface wiring layer 38 is connected to the wiring layer on the back surface 39 through a through hole electrode 36; an electrode pad 33 is formed on the surface of the semiconductor chip 31 and connected to the front surface wiring layer 38 on the resin substrate 34 by using a metal wiring 32; the back surface wiring layer 39 is provided with a solder ball 37 as an external electrode at a desired position; and the semiconductor chip 31 is encapsulated with a resin 35 using a transfer mold or potting. As described above, the electrode pad 33 on the surface of the semiconductor chip 31 is connected to the external electrode through the metal wiring 32, front surface wiring layer 38, through hole electrode 36 and back surface wiring layer 39.

When the package of a QFP or a BGA is used, the electrode pad formed on the surface of the semiconductor chip and outer lead is required to be maintained with a certain distance because the output is transferred from the electrode of the semiconductor chip by a bonded wiring. Therefore, the size of the package is greater than the semiconductor chip. Further, since the electrode pad must be formed in the periphery of the semiconductor chip, there is a drawback due to the necessity for forming the semiconductor chip itself of increased size.

Further, in the package of a BGA the radiation activity is lower compared with the case where only the mold resin is used for packaging because the resin substrate is used as a mounting substrate. Moreover, there is a problem of having the resin substrate curved because only a surface of a resin substrate mounted with the semiconductor chip is molded with the resin.

SUMMARY OF THE INVENTION

The present invention provides a semiconductor device comprising a semiconductor chip, a plurality of electrode pads formed on the semiconductor chip, a metal wiring having a desired pattern and connected to the electrode pad, an anisotropic conductive film containing fine conductive particles and laminated on the semiconductor chip including the metal wiring, and an external electrode, in which the anisotropic conductive film has a concave portion at a desired portion on the metal wiring and the metal wiring is connected to the external electrode through the intermediary of the fine conductive particles present in the anisotropic conductive film by inserting and melting when an external electrode is present in the concave portion.

The present invention also provides a method for forming a semiconductor device comprising (i) forming an electrode pad on a semiconductor wafer, and forming a metal wiring having a desired pattern connected to the electrode pad, and cutting the semiconductor wafer into a semiconductor chip, (ii) laminating an anisotropic conductive film comprising a fine conductive particle on the whole surface of the semiconductor chip including the electrode pad and the metal wiring, (iii) forming a concave portion by pressing a desired portion of the anisotropic conductive film on the metal wiring, and (iv) inserting and melting the external electrode in the concave portion to connect the external electrode to the metal wiring through the intermediary of the fine conductive particles present in the anisotropic conductive film.

The purpose of the present invention is to provide a semiconductor device in which increasing the size of a package itself is prevented and radiation activity is improved.

DETAILED DESCRIPTION OF THE INVENTION

The semiconductor chip for the present invention comprises a chip cut from a semiconductor wafer mounting a desired semiconductor element such as a transistor and capacitor, and having an interlayer insulating film on the semiconductor wafer.

The electrode pad formed on the semiconductor chip can be generally made of aluminum, and is not specifically limited. The thickness of the electrode pad is not specifically limited, for example, about 10,000 angstrom to 20,000 angstrom. The shape and size thereof may be adjusted depending on the size of the semiconductor device to be formed. The electrode pad may be formed to have a desired pattern by a known method, for example, photolithography and etching.

On the electrode pad, a passivation film may be formed before forming a metal wiring, for example, of $SiO_2$, SiN, PSG and a laminated film thereof by a known method such as the CVD method. The thickness of the passivation film is not specifically limited.

As the metal wiring, a single layered film made of a plating film may be used, provided that the film has a good adhesive property with the electrode pad and optionally with the passivation film. However, it is preferable to use a metal laminating film which comprises a barrier metal, a metal film used for adhering the barrier metal with the plating film to be formed thereon and the plating film. The barrier metal can be formed of TiW, TiN, Ti and the like in a thickness of 1000 to 3000 angstrom. Examples the metal films include a film of Au or Pt for adhering the barrier metal with the plating film in a thickness of 500 to 1000 angstrom. When the plating film is laminated on the metal film, it may be formed by using a known plating method, for example by using a plating solution comprising a desired conductive material such as Au in a thickness of 10 to 15 μm. The barrier metal and the metal film can be patterned to a desired pattern by selecting a suitable etchant. More specifically, when using Au, $I_2$+KI is used for etching, and when using TiW, $H_2O_2$ is used for etching. The plating film may relieve damage given to the area under the metal wiring when pressing the anisotropic conductive film to form a concave portion. In order to release the damage, a metal having low elasticity is used for the barrier metal, the metal film and the plating film. Preferably, Au is formed to a thickness of 10 μm or more as the plating film.

After forming the metal wiring described above on the semiconductor wafer, thermal treatment may be conducted in order to relax stress of the metal wiring and to improve the adhesive properties between the metal wiring and a underlying layer. The thermal treatment is preferably conducted at about 200° C. to about 400° C. for about 30 to 60 minutes in nitrogen atmosphere or in the air.

As the anisotropic conductive film laminated on the whole surface of the semiconductor chip including the electrode pad and the metal wiring of the present invention, a thermosetting resin in which the fine conductive particles having an average diameter of about 2 to about 15 μm are mixed may be used. Examples of the thermosetting resins include epoxy resin, phenol resin, urea resin, melamine resin, polyester resin and silicone resin, among which epoxy resin is preferable. The film thickness is preferably from about 20 to about 30 μm. The anisotropic conductive film is preferably in the form of a sheet. For example, the anisotropic conductive film in the form of a sheet may be adhered without leaving a space on the semiconductor chip by using a bonding tool. When the bonding tool is used, it is preferable to adhere the anisotropic conductive film at about 80° C. to about 100° C. by pressing it for about 5 to about 10 seconds at about 8 to about 12 Kg/cm².

As the fine conductive particles, plastic spheres plated with Au/Ni, or Ni particles and Pb/Sn particles can be used.

The anisotropic conductive film is formed out a desired concave portion on the surface thereof by pressing by a known tool used for forming external electrodes. As a result, a part of the fine conductive particles appears on the bottom surface of the concave portion. The condition for pressing may be varied depending on the size of the tool used for forming external electrodes, thickness of the anisotropic conductive film and the types of resins consisting of the anisotropic conductive film. The preferred condition for pressing can be at about 150° C. to about 200° C. for about 10 to about 30 seconds at about 50 to about 80 g/concave portion.

Further, the external electrode is inserted and melted in the above concave portion. Preferred examples of the external electrode include a solder ball or a cu-plated plastic covered with a solder. The external electrode is preferably almost spherical. The size of the solder ball is not specifically limited and may be adjusted depending on the size of the concave portion. For example, a ball having a diameter of about 0.1 to about 1 mm may be used.

Methods for inserting and melting the external electrode in the concave portion can be as follows; the external electrode having a diameter slightly greater than that of the concave portion is selected and placed in the concave portion; then, it is heated at about 200° to about 220° C. for about 2 to about 5 minutes under nitrogen atmosphere to melt a part of the external electrode so as to stick the external electrode to the bottom of the concave portion. As described above, when the external electrode is inserted and melted in the bottom of the concave portion, the external electrode comes into contact directly with the fine conductive particles on the bottom surface of the concave portion, and further the fine conductive particles are connected to the metal wiring of the underlying layer. As a result, the external electrode is connected to the metal wiring through the intermediary of the fine conductive particles.

According to the present invention, the semiconductor wafer mounting the electrode pad and the metal wiring is preferably cut into the semiconductor chips before laminating the anisotropic conductive film thereon.

The semiconductor device of the present invention and a method for forming the same are now described in detail with reference to the Examples as follows.

EXAMPLE 1

Figure 10:
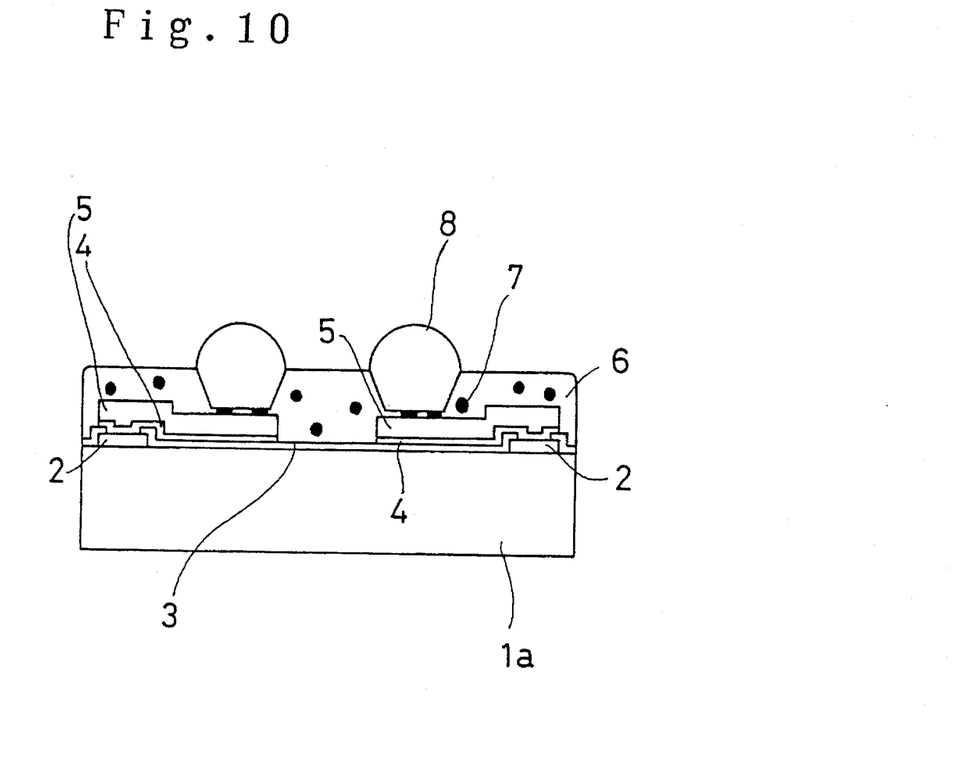

As shown in FIG. 10, a semiconductor device of the present invention comprises a semiconductor chip 1a; a plurality of electrode pads 2 formed on the semiconductor chip 1a; a metal wiring 4&5 having a desired pattern and being connected to the electrode pad 2; an anisotropic conductive film 6 laminated on the semiconductor chip 1a including the metal wiring 4&5 and the electrode pad 2, and comprising a fine conductive particle 7; and an external electrode 8. The metal wiring 4&5 is formed of a metal film 4 and plating film 5. The metal film 4 include a barrier metal (not shown) as an under layer thereof. The anisotropic conductive film 6 has a concave portion at a desired place on the metal wiring 4 and 5. The external electrode 8 is inserted and melted in the concave portion to connect to the metal wiring through the intermediary of the fine conductive particles 7 present in the anisotropic conductive film 6.

The method for forming the above semiconductor device is described with reference to FIGS. 1 to 10.

The semiconductor device of the present invention was formed using a wafer on which general semiconductor elements were mounted by techniques for forming a bump (projected electrode) which was used for TCP (Tape Carrier Package) and a flip chip.

Figure 1:
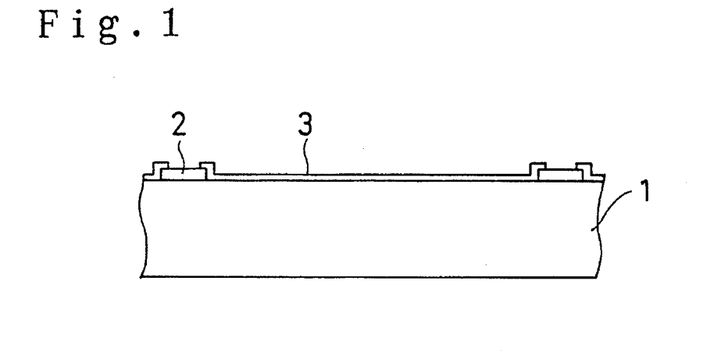
FIGS. 1 to 10 are schematic sectional views of a main part showing a process for forming a semiconductor device of the first example of the present invention

As shown in FIG. 1, an Al electrode 2 and a passivation film 3 is formed with a desire configuration on a semiconductor wafer 1 mounted general semiconductor elements.

Figure 2:
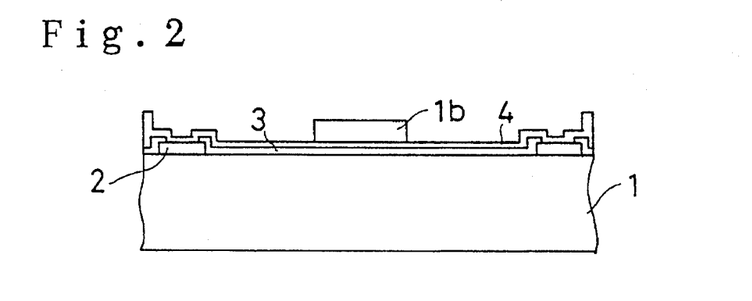

Next, as is seen from FIG. 2, the metal film 4 was deposited on the whole surface of the wafer 1 including the Al electrode 2 and passivation film 3 by sputtering. As the metal film 4, Ti-W (2,500 angstrom) was used for a barrier metal for preventing diffusion and Au (1,000 angstrom) for a metal film for adhering with the plating film was used. A photoresist was coated on the metal film 4, and a desired resist pattern 1b was formed by opening the photoresist on the plating portion used for wiring by photolithography technique. Preferred photoresist was a positive resist capable of coating with a thickness of about 15 μm.

Figure 3:
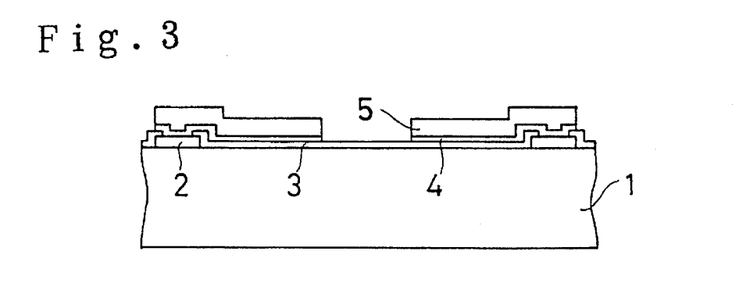

Subsequently, as is shown in FIG. 3 the opening of the photoresist was electroplated to form a plating film 5 having a thickness of about 15 μm, thereby obtaining the metal wiring 4&5 formed of the metal film 4 and plating film 5. Preferred plating solution used for this purpose was a non-cyanic Au plating solution. Then, the resist pattern 1b was removed, and the metal film 4 formed of Au and Ti—W was etched using the plating film 5 as a mask to form a desired pattern. As a etchant, $I_2+KI$ was used for Au and $H_2O_2$ was used for Ti—W. Further, the resulting structure was subjected to thermal treatment in the nitrogen atmosphere at about 300° C. for about 30 to about 60 minutes in order to relax the plating film 5 from stress and to improve adhesive properties with the passivation film 3 and the plating film 5. When the plating film 5 is pressed in the following process, it works to release the shock given to the elements located under the external electrode.

Figure 4:
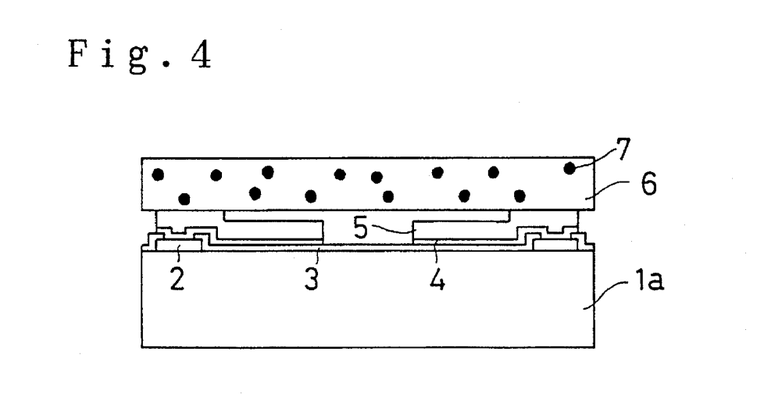

As shown in FIG. 4, the wafer 1 provided with the plating film 5 connecting the Al electrode 2 to the external electrode was diced to divide it into same pieces of semiconductor chips 1a. The anisotropic conductive film 6 was adhered to the divided semiconductor chip 1a. The anisotropic conductive film 6 was an insulating resin in which conductive particles 7 such as metal particles or metal plating particles were diffused. As the resin used for the anisotropic conductive film 6, a thermosetting resin is preferable because the resin was used for sealing to protect semiconductor elements. More preferable resin is a thermosetting epoxy resin.

Figure 5:
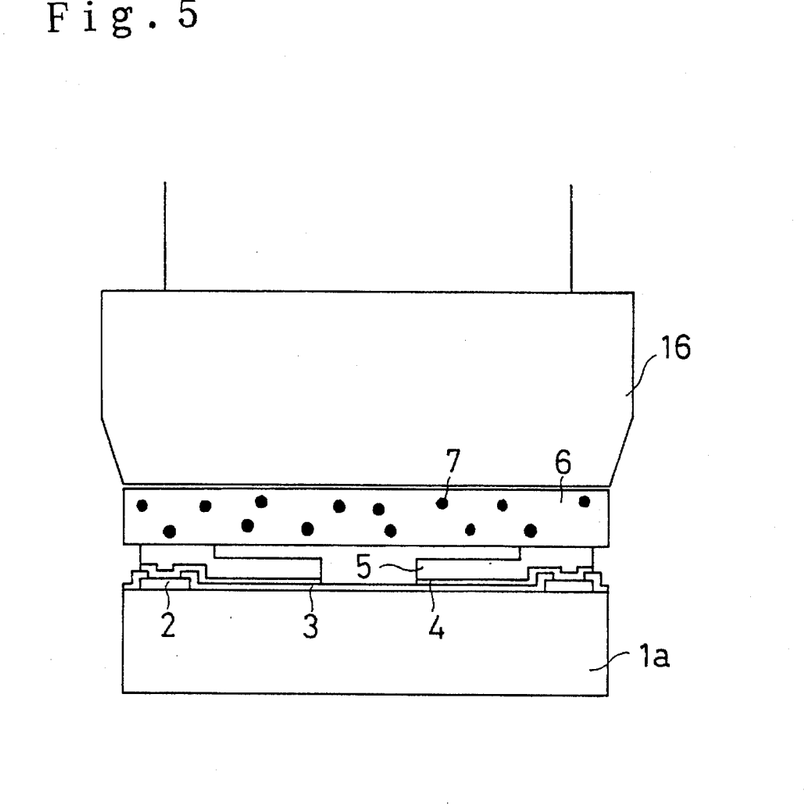
Figure 6:
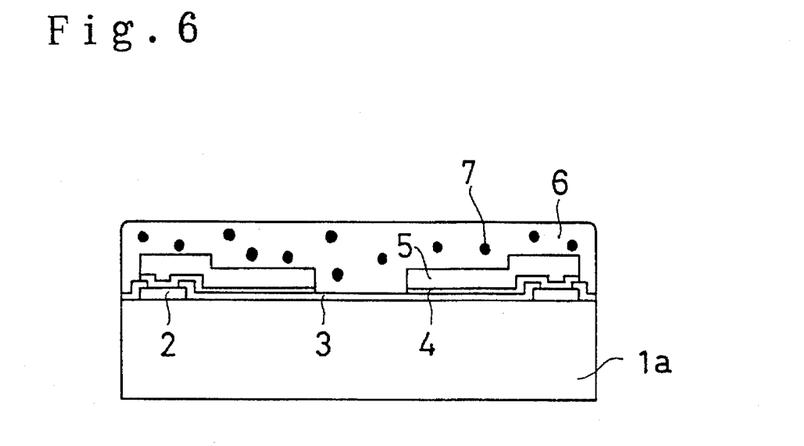

As shown in FIG. 5, the anisotropic conductive film 6 was pressed by using a bonding tool having a bottom surface of the almost same area as that of the semiconductor chip 1a, and sealed with the surface of the semiconductor chip 1a as shown in FIG. 6 by pressing the anisotropic conductive film 6 at 10 kg/cm² for 5 seconds at 100° C.

Figure 7:
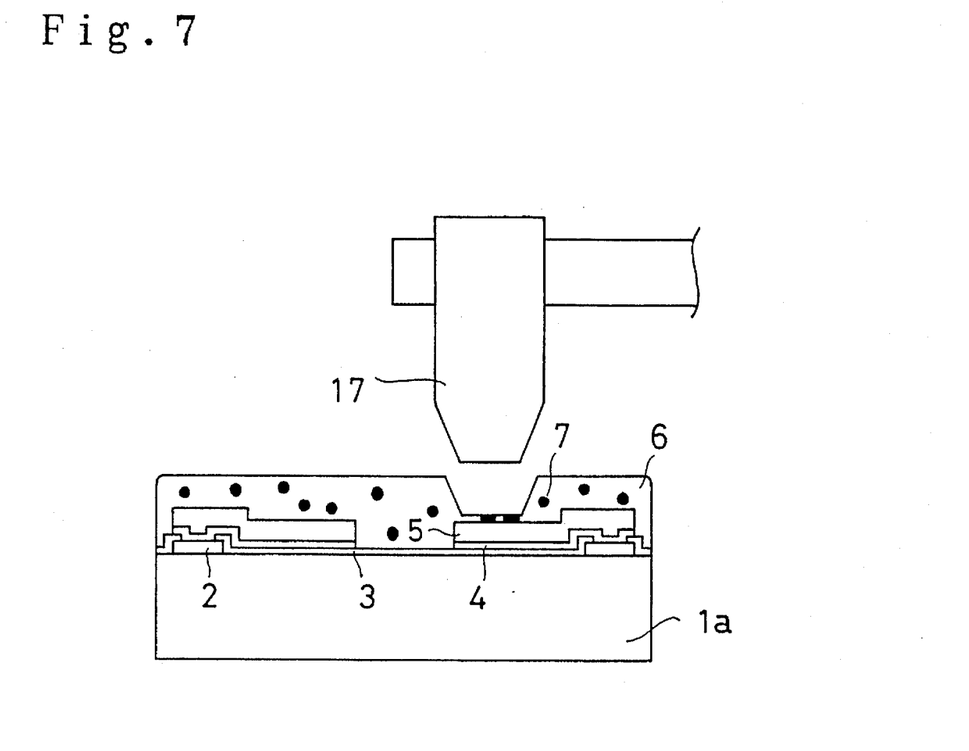
Figure 8:
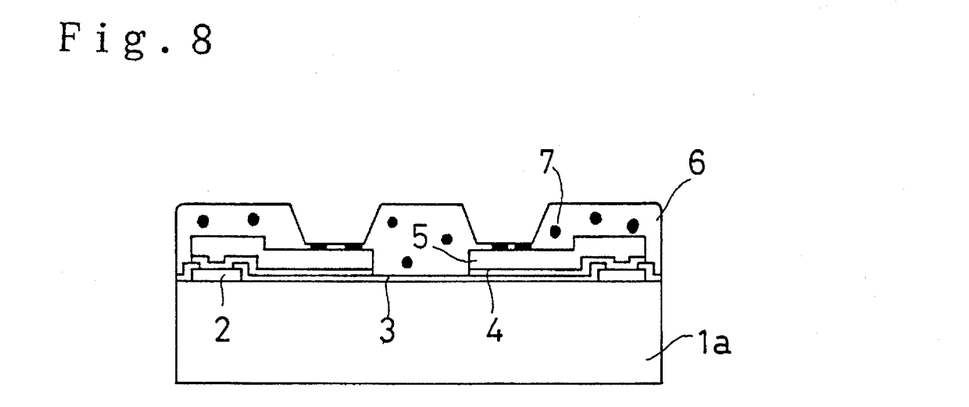

As shown in FIG. 7, after that, every part of the anisotropic conductive film 6 necessary for electrically connecting to the plating film 5 was pressed respectively by using an external electrode forming tool 17. In this process, it was pressed at about 50 to about 80 g/external electrode for about 20 seconds at about 180° C. As is seen from FIG. 8, the pressed portion for the external electrode had a shape of an upside-down truncated cone-like concave portion, thus a part of the conductive particles 7 appear at the bottom surface of the concave. In contrast, the portion which was not pressed remains insulated.

Figure 9:
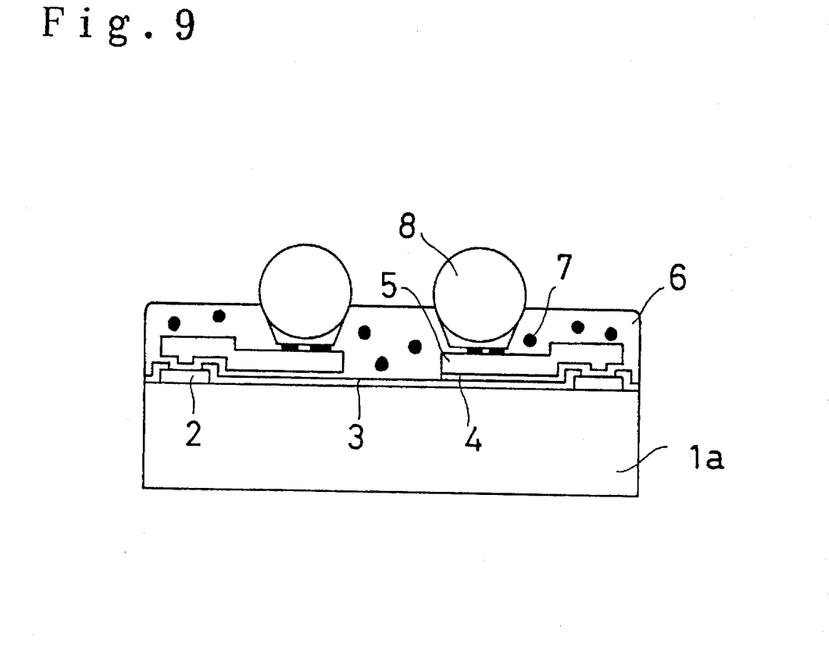

Then, as shown in FIG. 9, a solder ball was inserted in the concave portion as the external electrode 8. The solder ball 8 was formed of only a solder ball or a Cu-plated plastic covered with solder.

After inserting the solder ball 8, the semiconductor chip 1a was heated at about 200° C. for about 2 to about 5 minutes to melt the lower portion of the solder ball 8 and to stick to the concave portion of the anisotropic conductive film 6, whereby the solder ball 8 came into contact with the conductive particles 7 present in the anisotropic conductive film 6 and was connected to the plating film 5 through the conductive particles 7, as shown in FIG. 10.

Figure 11:
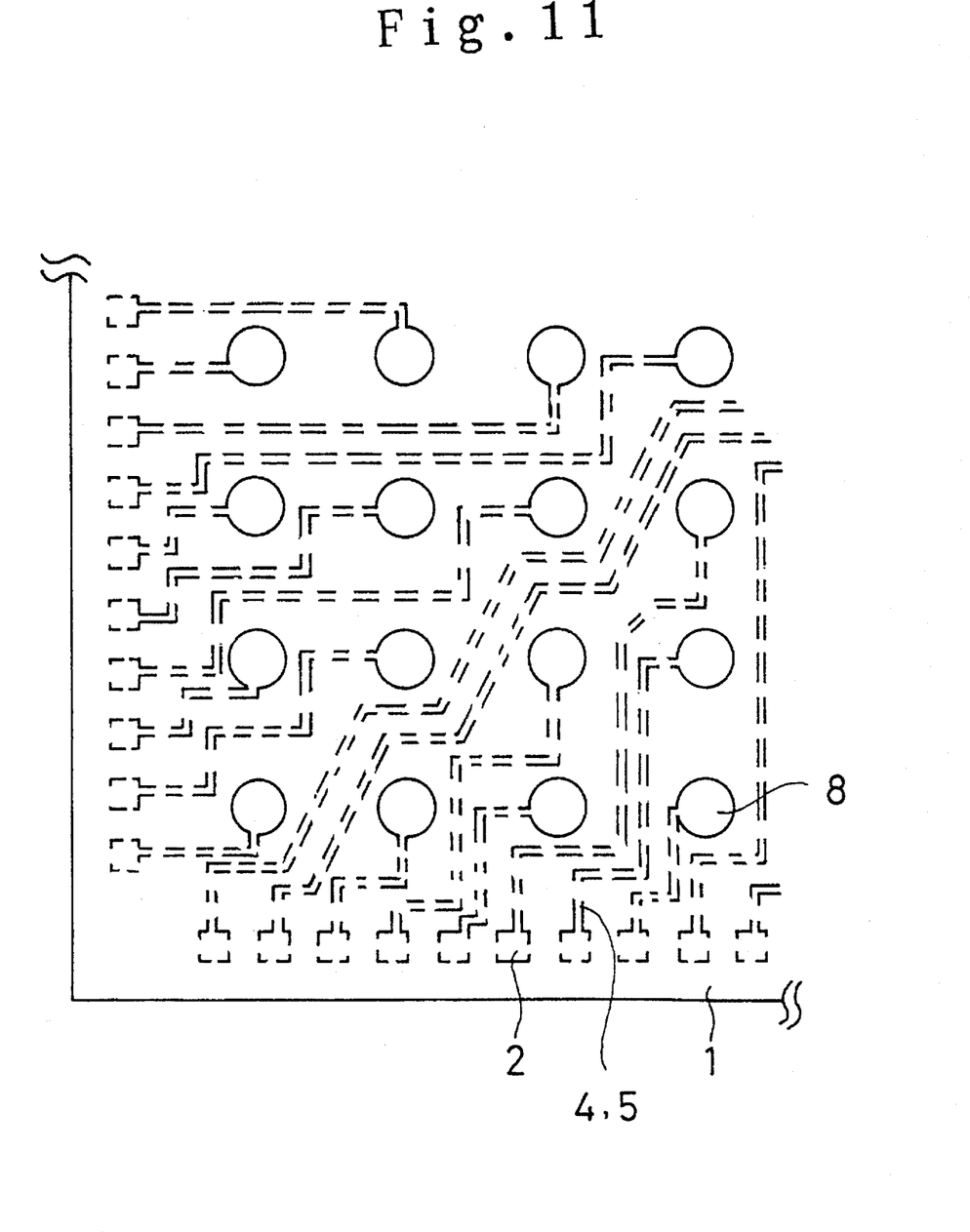
FIG. 11 is a schematic plan view of a main part showing a semiconductor device of the present invention.

When thus formed semiconductor device was aligned with 100 pin packages using a solder ball having a diameter of 0.7 mm with a pitch of 1.0 mm as 10×10 matrices, the outer package size of the semiconductor device can be reduced to about 11 mm square. For example, as shown in FIG. 11, a few number of metal wirings comprising metal film 4 and plating film 5 was formed between the solder balls 8 in accordance with the number of the solder balls 8, whereby the semiconductor device can be mounted with efficient wirings.

On the other hand, according to the conventionally used QFP, even when the semiconductor chips of the same size are used for 100 pin packages with an outer lead pitch of 0.5 mm, the outer size of the resin sealing package was 14 mm square and the outer size including the outer leads was 16 mm square. In the case of a BGA package, the outer package size was 13 mm square, even when the solder balls having diameters of 0.7 mm were aligned with a pitch of 1.0 mm as 10×10 matrices.

Figure 12:
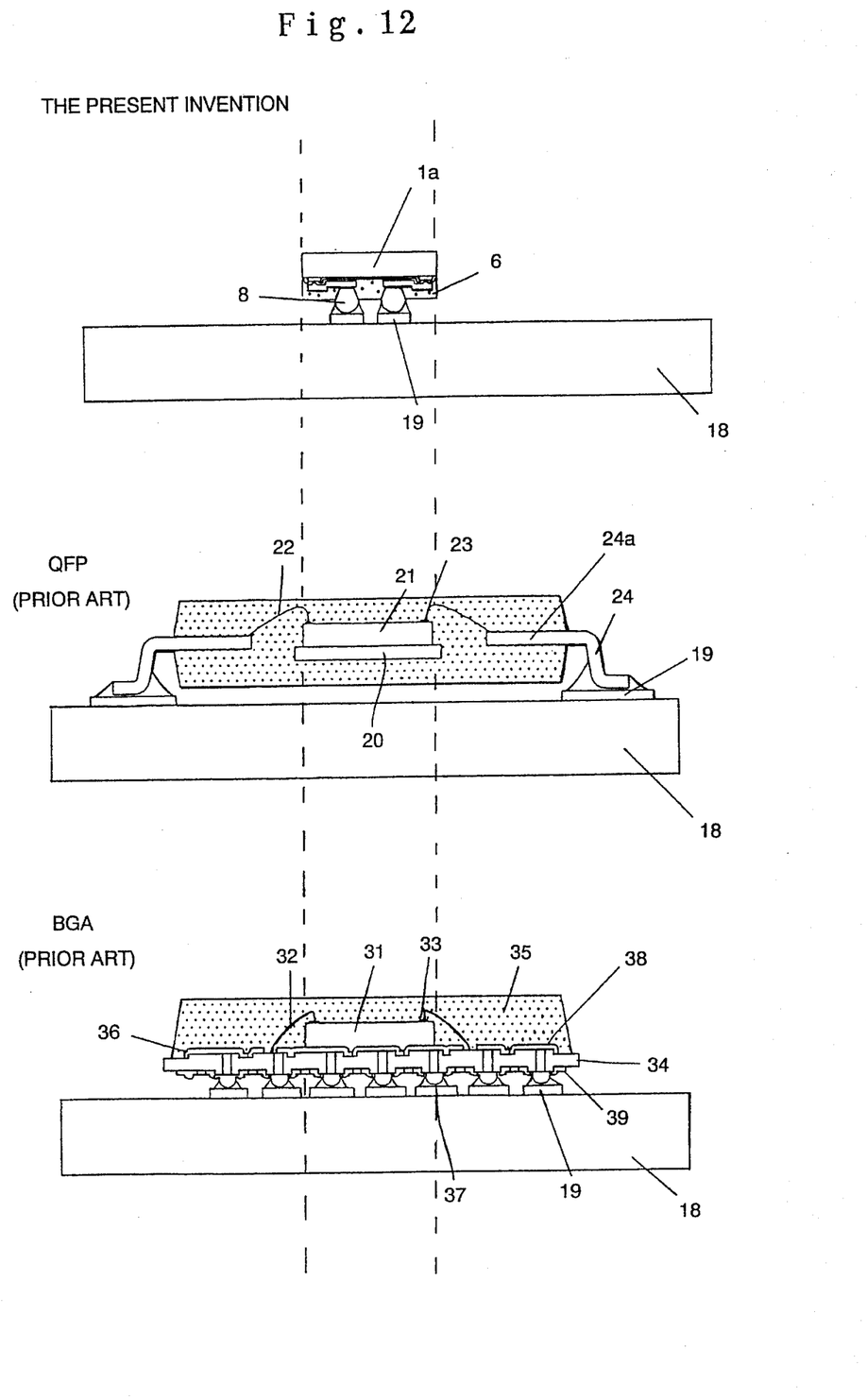
FIG. 12 is a view for comparing the size of the semiconductor device of the present invention with the conventional one.

For example, FIG. 12 shows a comparison among the semiconductor device of the present invention, QFP and the package of BGA in which the same size semiconductor chips 1a were mounted. In the QFP and the package of BGA, the outer lead 24 and solder ball 37 working as outer terminals connected to the electrode terminal 19 of the packaged substrate 18 were required to be placed outside of the semiconductor chip 1a, so that the area necessary for packaging was made great. In contrast, the semiconductor device according to the present invention, the solder ball 8 working as the external electrode can be housed within the outline of the semiconductor chip 1a. Therefore, it was possible for the present invention to set the pin pitch greater than that of other packages and to make the outer package size smaller.

EXAMPLE 2

A semiconductor device was formed in the same manner as in Example 1 except for the layout of the Al electrode working as the electrode pad. When the semiconductor chip was designed, the Al electrode working as the electrode pad in Example 2 was placed in a region where the solder ball working as the external electrode was to be placed instead of placing it in the periphery of the semiconductor chip.

Figure 13:
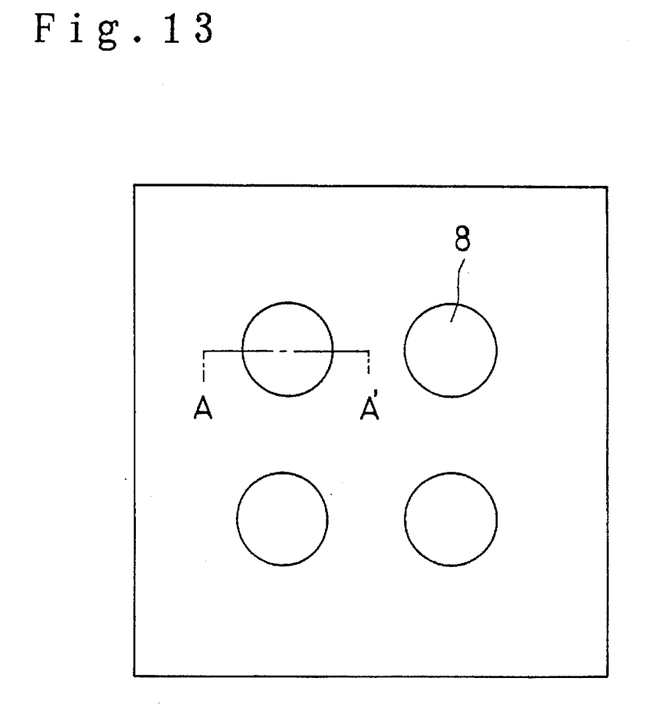
FIG. 13 is a schematic plan view of a main part showing a semiconductor device of the second example of the present invention.
Figure 14:
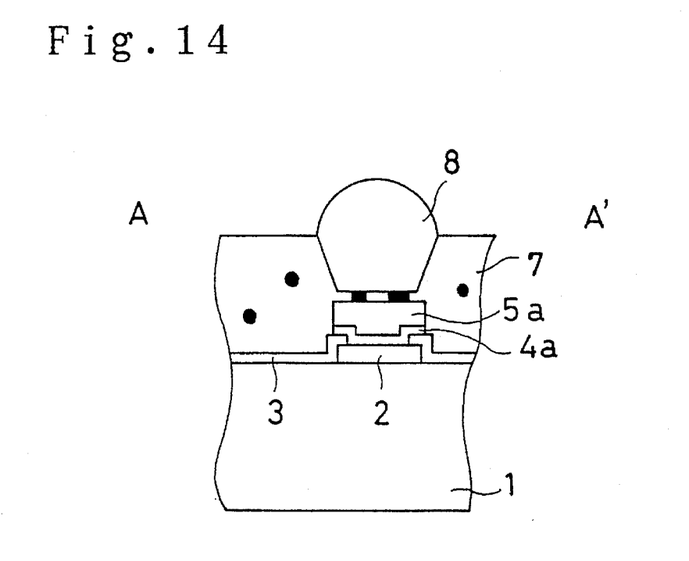
FIG. 14 is a sectional view taken along line A—A' in FIG. 13.

As is seen from FIGS. 13 and 14, the thus formed semiconductor device only requires wirings such as a metal film 4a and a plating film 5a, does not require wirings such as a metal film 4 and a plating film 5 described in Example 1. Moreover, the package size can be made small.

According to the semiconductor device of the present invention, wire bonding is not necessitated and the package size can be reduced to the size similar to the size of the semiconductor chip. In addition, the electrode pad is not necessarily formed in the periphery of the semiconductor chip because the external electrode is formed at an optional position. Accordingly, limitations as to the design of the semiconductor device are released. Further, since only the surface layer of the semiconductor chip is coated with the anisotropic conductive film, excellent heat radiation can be realized and the package size can be minimized.

According to the method for forming the semiconductor device of the present invention, the external electrode can be formed in an optional position and the electrode pad is not necessarily formed in the periphery of the semiconductor chip. Moreover, since the size of the semiconductor chip can be made similar to the package size, the semiconductor chip can be made greater than those sealed in the conventional packages such as QFP. Therefore, it is not necessary to strictly control the process for forming a wafer, and the semiconductor chip can be manufactured by using the wafer formed in a fairly simple process. As a result, the cost required for the wafer process can be controlled.

What we claimed is:

1. A semiconductor device comprising:

a semiconductor chip, a plurality of electrode pads formed on the semiconductor chip, a metal wiring formed on the semiconductor chip and having a desired pattern and connected to the electrode pad, an anisotropic conductive film containing fine conductive particles and laminated on the semiconductor chip including the metal wiring, and an external electrode arranged on the semiconductor chip, in which the anisotropic conductive film has a concave portion at a desired portion on the metal wiring and the external electrode is positioned in the concave portion and connected to the fine conductive particles whereby the metal wiring is connected to the external electrode through the intermediary of the fine conductive particles present in the anisotropic conductive film.

2. A semiconductor device according to claim 1, in which the fine conductive particles are plastic spheres plated with Ni and then Au, or are Ni particles or are Pb/Sn particles.

3. A semiconductor device according to claim 1, in which the fine conductive particle has an average diameter of 2 to 15 μm.

4. A semiconductor device according to claim 1, in which the anisotropic conductive film is made of a thermosetting resin.

5. A semiconductor device according to claim 1, in which the external electrode is a solder ball or a Cu-plated plastic ball covered with solder.

6. A semiconductor device comprising:

a semiconductor chip, a plurality of electrode pads formed on the semiconductor chip, a metal film formed on the semiconductor chip connected to the electrode pad, an anisotropic conductive film containing fine conductive particles and laminated on the semiconductor chip including the metal film, and an external electrode arranged on the semiconductor chip, in which the anisotropic conductive film has a concave portion at a desired portion on the metal film and the external electrode is positioned in the concave portion and connected to the fine conductive particles whereby the metal film is connected to the external electrode through the intermediary of the fine conductive particles present in the anisotropic conductive film.

* * * * *